United States Patent

Naaman

(10) Patent No.: US 9,438,246 B1
(45) Date of Patent: Sep. 6, 2016

(54) SYSTEM AND METHOD FOR QUBIT READOUT

(71) Applicant: Ofer Naaman, Ellicott City, MD (US)

(72) Inventor: Ofer Naaman, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/845,981

(22) Filed: Sep. 4, 2015

(51) Int. Cl.
*H03K 19/195* (2006.01)

(52) U.S. Cl.
CPC .................................. *H03K 19/195* (2013.01)

(58) Field of Classification Search
CPC ... H01L 39/025; H01L 39/22; H01L 39/223; H03K 19/195
USPC ......................................................... 326/1–7
See application file for complete search history.

(56) References Cited

U.S. PATENT DOCUMENTS

| | | | | |
|---|---|---|---|---|
| 2005/0001209 A1* | 1/2005 | Hilton | ................. | B82Y 10/00 257/20 |
| 2006/0097747 A1* | 5/2006 | Amin | ................. | G06N 99/002 326/6 |
| 2013/0009677 A1* | 1/2013 | Naaman | ................. | B82Y 10/00 327/113 |
| 2013/0015885 A1* | 1/2013 | Naaman | ................. | H03K 3/38 327/1 |
| 2015/0263736 A1* | 9/2015 | Herr | ................. | H03K 3/38 326/4 |

* cited by examiner

*Primary Examiner* — Jason M Crawford
(74) *Attorney, Agent, or Firm* — Tarolli, Sundheim, Covell & Tummino LLP

(57) ABSTRACT

A system is provided for multiplexed readout of qubits. The system comprises a plurality of bandpass (BP) filter resonant sections that are each coupled to a different respective point on a read line, wherein each BP filter resonant section is coupleable to a respective qubit through a respective qubit readout resonator. The system further comprises a plurality of tunable couplers, wherein each tunable coupler is coupled between a respective BP filter resonant section and a qubit readout resonator, and a coupling controller that controls the coupling strength of each qubit to the read line by controlling the impedance of each tunable coupler of the plurality of tunable couplers.

20 Claims, 8 Drawing Sheets

SYSTEM AND METHOD FOR QUBIT READOUT

This invention was made with Government support under Contract No. 30059298. The Government has certain rights in this invention.

TECHNICAL FIELD

The present invention relates generally to superconducting circuits, and more particularly to a system and method for qubit readout.

BACKGROUND

In quantum computer architectures based on circuit quantum electrodynamics (cQED), it is a common practice to multiplex a plurality of qubit readout resonators onto a single 50 Ohm transmission line. This can be done by coupling each of the qubit readout resonators having a slightly different resonant frequency via a fixed mutual inductance or a fixed capacitor to the transmission line, with typical coupling Q's of the order of several thousands. While stronger coupling is usually desirable for faster readout times, it also contributes to higher decoherence in the circuit (i.e., resetting of the qubit). Readout fidelity of qubits is partially limited by the qubit energy relaxation through the resonator into the transmission line. Additionally, it is desirable to isolate the qubits from the 50 ohm transmission during logic and/or storage operations of the qubit. Current techniques suffer in either strong coupling and/or isolation of the qubit readout resonators to and from the single 50 ohm transmission line.

SUMMARY

In one example, a system is provided for readout of qubits. The system comprises a plurality of bandpass (BP) filter resonant sections that are each coupled to a different respective point on a read line, wherein each BP filter resonant section is coupleable to a respective qubit through a respective qubit readout resonator. The system further comprises a plurality of tunable couplers, wherein each tunable coupler is coupled between a respective BP filter resonant section and a qubit readout resonator, and a coupling controller that controls the coupling strength of each qubit readout resonator to the read line by controlling the impedance of each tunable coupler of the plurality of tunable couplers.

In another example, a system is provided for multiplexed readout of qubits. The system comprises a plurality of BP filter resonant sections forming a BP filter with each BP filter resonant section being coupled between a different respective point on a read line and a respective qubit through its respective qubit readout resonator. The system further comprises a plurality of tunable couplers with each tunable coupler being galvanically coupled to a respective BP filter resonant section. Each tunable coupler is a superconducting quantum interference device (SQUID) having at least one Josephson junction, such that flux induced in the SQUID changes the inductance of the Josephson junction and the coupling strength of its respective qubit readout resonator to the read line. The system also comprises a coupling controller that controls the coupling strength of each qubit readout resonator to the read line by controlling the flux induced in each SQUID.

In yet a further example, a method is provided for multiplexed readout of qubits. The method comprises providing a system comprising a plurality of BP filter resonant sections forming a BP filter with each BP filter resonant section being coupled between a different respective point on a read line and a respective qubit of a plurality of qubits through its respective qubit readout resonator of a plurality of qubit readout resonators. The method further comprises coupling one or more qubits to the read line, while isolating each of the other of the plurality of qubits from the read line, providing an input signal to an input terminal of the read line, and reading an output signal from an output terminal of the read line. The method further comprises determining the state of the qubit based on the change between the input signal and the output signal.

BRIEF DESCRIPTION OF THE DRAWINGS

FIG. 4 (b) illustrates a graph of S-parameters versus frequencies showing the filter response with all couplers in their "on" state for a simulation of the operation of FIG. 2 employing Agilent ADS software.

FIG. 5 (b) illustrates a graph of a response of the qubit readout-resonators seen from a very weakly coupled port, and is a measure of the readout-resonator loaded quality factors for a simulation of the operation of FIG. 2 employing Agilent ADS software with the four different couplers having a particular coupling setting.

FIG. 7 (b) illustrates a graph of an example of alternate S-parameters versus frequency of the filter responses for a simulation of the operation of FIG. 6 employing Agilent ADS software.

DETAILED DESCRIPTION

The present disclosure relates generally to superconducting circuits, and more particularly to a system and method for multiplexed readout of qubits. In one example, each of the qubits are coupled to respective qubit readout resonators. Each qubit readout resonator resonates at a different frequency relative to each other qubit readout resonator. A given qubit readout resonator will resonate at a slight variation of its respective frequency based on a state of its associated qubit, such that a read of the given qubit readout resonator can give rise to inferring the a state of an associated qubit. Each resonator and its associated qubit is coupleable to a respective BP filter resonant section via a respective tunable coupler. Each BP filter resonant section are coupled to one another via a read line to form a bandpass filter. The pass-band of the bandpass filter is designed to encompass the range of qubit readout resonator frequencies. Each BP filter resonant section is coupled to a different point on the read line formed from a plurality of series coupled coupling capacitors. The BP filter resonant sections and the series coupling capacitors are selected to provide a desired passband characteristics of the filter, and in particular a 50 ohm impedance matching with the read line.

The read line receives a read input signal at its input terminal. The read signal may contain a single tone or a plurality of tones with frequencies addressing the plurality of readout resonators. The read input signal can be altered by a read of one or more of the qubits via their associated tunable couplers and their respective BP filter resonant sections. A read output signal is then provided as the altered read input signal at the read output terminal of the read line. Each tunable coupler can be tuned to one of strong coupling of the associated qubit readout resonator to the read line, intermediate coupling of the associated qubit readout resonator to the read line, or strong isolation of the associated qubit readout resonator to isolate the qubit from the read line. Strong coupling of the qubit readout resonator to the read line allows for a fast reset of that particular qubit removing any state information from the qubit; this occurs also in the absence of an input signal. An intermediate coupling of the qubit to the read line can be selected which allows for a read out of the qubit state. A strong isolation of the qubit from the read line allows for operations to be performed on the qubit without any coupling of the qubit to the read line, and the retention of state information.

Figure 1:
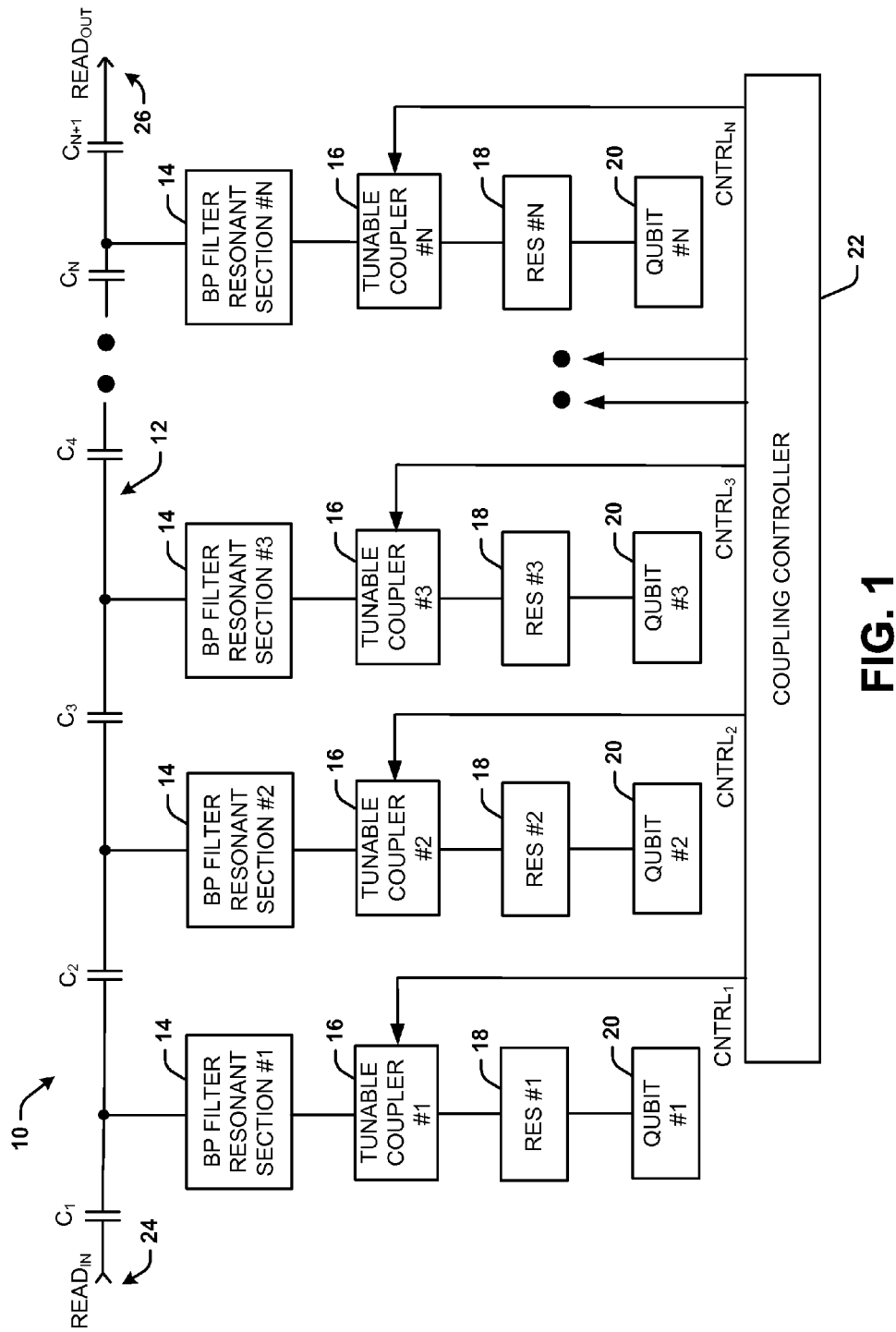
FIG. 1 illustrates a schematic block diagram of a system for multiplexed readout of a plurality of qubits.

FIG. 1 illustrates a schematic block diagram of a system 10 for multiplexed readout of a plurality of qubits. The system 10 includes a plurality of bandpass (BP) filter resonant sections 14, labeled BP filter resonant section #1 to BP filter resonant section #N, where N is an integer greater than one. Each BP filter resonant section 14 is coupled to a different respective point on a read line 12 formed from a plurality of series coupled coupling capacitors, labelled $C_1$ through $C_{N+1}$. A first coupling capacitor $C_1$ is coupled to a matched input port and a last coupling capacitor $C_{N+1}$ is coupled to a matched output port. A plurality of qubits 20, labeled qubit #1 through qubit #N, are coupled to respective qubit readout resonators 18 of N qubit readout resonators. Each of the qubit readout resonators 18 resonates at a different frequency relative to each other qubit readout resonator 18. A given qubit readout resonator 18 will resonate at a slight variation of its respective frequency based on a state of its associated qubit 20, such that a read of the given qubit readout resonator 18 can give rise to inferring the state of its associated qubit 20.

Each qubit readout resonator 18 is coupleable to the read line 12 through a respective BP resonant section 14 of the plurality of BP resonant sections via a respective tunable coupler 16 of a plurality of tunable couplers, labeled tunable coupler #1 through tunable coupler #N. The BP resonant sections 14 and coupling capacitors $C_1$ through $C_{N+1}$ are configured to maintain the 50 ohm impedance matching of the read line 12 over the pass band of the filter. Each tunable coupler 16 can be tuned to one of strong coupling of the associated qubit 20 to the read line 12 via its associated BP resonant section 14, or an intermediate coupling of the associated qubit 20 to the read line 12, or strong isolation of the associated qubit 20 to isolate the qubit 20 from the read line 12. As previously stated, strong coupling of the qubit 20 to the read line 12 allows for a fast reset of that particular qubit 20. A strong isolation of the qubit 20 from the read line 12 allows for operations to be performed on the qubit without any coupling of the qubit 20 to the read line 12, and the retention of state information. Additionally, an intermediate coupling of the qubit 20 to the read line 12 via the tunable coupler 16 can be selected which allows for a read, and the strength of the coupling can be continuously tuned to optimize the readout fidelity of each of the qubits 20.

A coupling controller 22 controls the coupling strength of each qubit 20 to the read line 12 via respective tunable couplers 16 by control signals labeled $CNTRL_1$ through $CNTRL_N$. The coupling controller can utilize single flux quantum (SFQ) logic (e.g., reciprocal quantum logic (RQL) logic), and/or conventional logic. A read input signal ($READ_{IN}$) can be provided at a read input port 24, and a read output signal ($READ_{OUT}$) can be provided at a read output port 26. The read input signal is altered by a read of one or more of the qubits 20 via their associated tunable couplers 16 and their associated BP resonant sections 14. A read output signal ($READ_{OUT}$) is then provided as the altered read input signal ($READ_{IN}$) at the read output port 26 of the read line 12, which provides the state information associated with the one or more read qubits 20.

Figure 2:
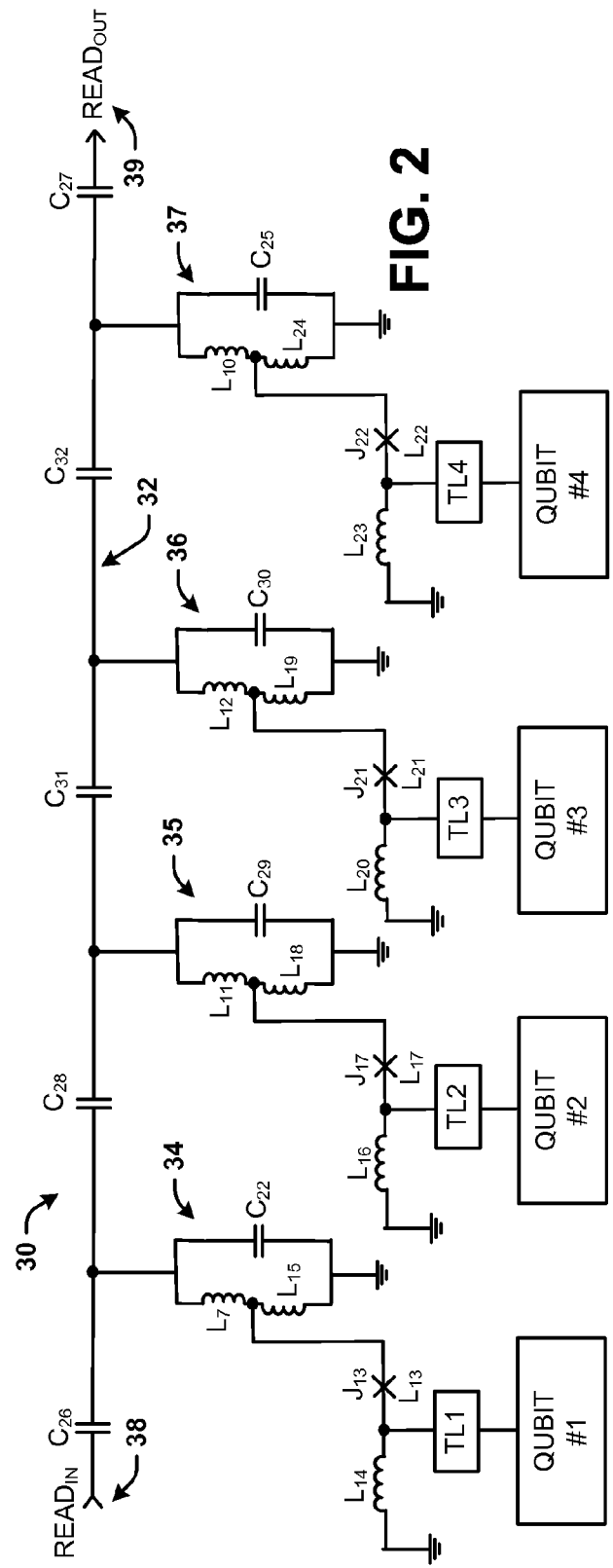
FIG. 2 illustrates another example of a schematic block diagram of a system for multiplexed readout of a plurality of qubits.

FIG. 2 illustrates another example of a system 30 for multiplexed readout of a plurality of qubits. In the example of FIG. 2, tunable couplers are coupled to respective BP filter resonant sections via galvanic coupling between qubit readout resonators (TL1 through TL4) and a read line 32 achieving very strong maximum coupling and facilitating multiplexed qubit reset and readout. The system 30 includes a plurality of BP resonant sections each formed from a pair of shunt inductors connected in parallel with a capacitor. Each BP filter resonant section is coupled to a different respective point on the read line 32 formed from a plurality of series coupled coupling capacitors, labelled $C_{26}$, $C_{28}$, $C_{31}$, $C_{32}$ through $C_{27}$. A first coupling capacitor $C_{26}$ is coupled to a matched input port and a last coupling capacitor $C_{27}$ is coupled to a matched output port to assure 50 ohm impedance matching is maintained throughout the read line 32.

In the present example system 30, there are four BP filter resonant sections that form a BP filter. A first BP filter resonant section 34 includes shunt inductor $L_7$ in series with shunt inductor $L_{15}$ with both shunt inductor $L_7$ and $L_{15}$ being in parallel with a capacitor $C_{22}$. A second BP filter resonant section 35 includes shunt inductor $L_{11}$ in series with shunt inductor $L_{18}$ with both shunt inductor $L_{11}$ and $L_{18}$ being in parallel with a capacitor $C_{29}$. A third BP filter resonant section 36 includes shunt inductor $L_{12}$ in series with shunt inductor $L_{19}$ with both shunt inductor $L_{12}$ and $L_{19}$ being in parallel with a capacitor $C_{30}$. A fourth BP filter resonant section 37 includes shunt inductor $L_{10}$ in series with shunt inductor $L_{24}$ with both shunt inductor $L_{10}$ and $L_{24}$ being in parallel with a capacitor $C_{25}$. The BP filter resonant sections are configured to maintain the 50 ohm impedance matching with the read line.

A plurality of qubits, labeled qubit #1 through qubit #4, are coupled to respective qubit transmission line resonators, labeled TL1 through TL4. Each of the qubit readout resonators resonates at a different frequency relative to each other qubit readout resonator. A given qubit readout resonator will resonate at a slight variation of its respective frequency based on a state of its associated qubit, such that a read of the given qubit readout resonator can give rise to inferring a state of its associated qubit.

Each qubit readout resonator is coupleable to the read line 32 through its respective BP filter resonant section via a respective tunable coupler. Each tunable coupler is formed from an RF SQUID. For example, a first tunable coupler is formed from an inductor $L_{14}$, a Josephson junction $J_{13}$ and one of the shunt inductors $L_{15}$ of the first BP filter resonant section 34. A second tunable coupler is formed from an inductor $L_{16}$, a Josephson junction $J_{17}$ and one of the shunt inductors $L_{18}$ of the second BP filter resonant section 35, and a third tunable coupler is formed from an inductor $L_{20}$, a Josephson junction $J_{21}$ and one of the shunt inductors $L_{19}$ of the third BP filter resonant section 36. A fourth tunable coupler is formed from an inductor $L_{23}$, a Josephson junction $J_{22}$ and one of the shunt inductors $L_{24}$ of the fourth BP filter resonant section 37. Each tunable coupler (RF SQUID) can be tuned to one of strong or intermediate coupling of the associated qubit to the read line 32 via its associated BP filter resonant section, or tuned to be in strong isolation of the associated qubit to isolate the qubit from the read line 32.

A coupling controller (not shown) controls the coupling strength of each qubit to the read line 32 via respective tunable couplers by control signals. A read input signal ($READ_{IN}$) can be provided at a read input port 38 of the read line 32. The read input signal ($READ_{IN}$) can be altered by a read of one or more of the qubits at a time via the associated tunable coupler and its respective BP filter resonant section. A read output signal ($READ_{OUT}$) is then provided as the altered read input signal at a read output port 39 of the read line 32, which provides the state information associated with the one or more read qubits. While FIG. 2 shows only four qubits multiplexed via a 4-section filter, any number N of qubits can be multiplexed via a properly designed N-section band-pass filter as illustrated in FIG. 1.

Figure 3:
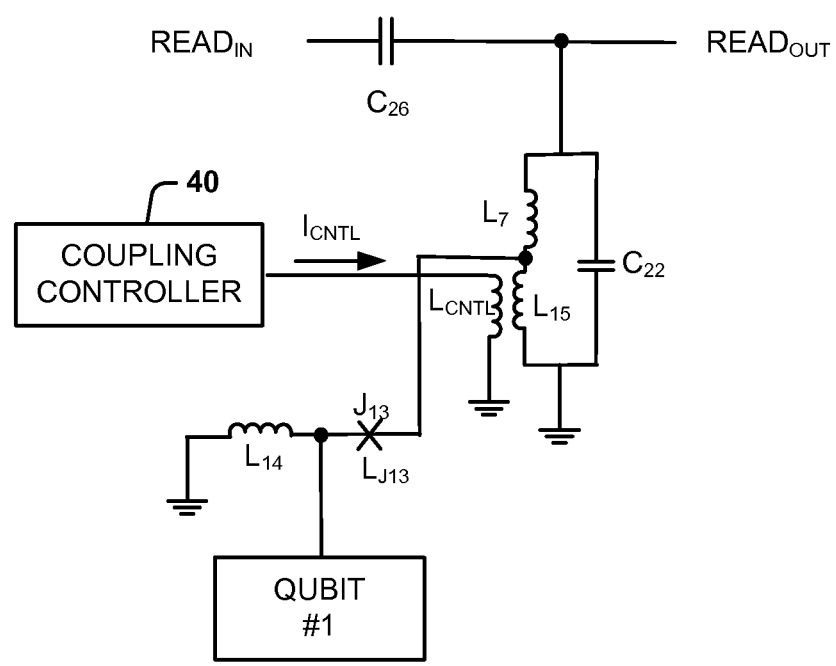
FIG. 3 illustrates a schematic diagram of a portion of the system of FIG. 2 as it relates to the reading of the first qubit.

FIG. 3 illustrates a schematic diagram of a portion of the system of FIG. 2 as it relates to the reading of the first qubit (Qubit #1). As illustrated in FIG. 3, the first BP filter resonant section 34 includes a shunt inductor formed by inductors $L_7$ and $L_{15}$ in parallel with the capacitor $C_{22}$. The tunable coupler formed by an RF SQUID that includes junction inductance $L_{J13}$ and inductors $L_{10}$ and $L_{15}$, and is galvanically coupled to the filter's resonant sections by sharing a fraction of the shunt inductance. For example, the first qubit readout resonator TL1 is galvanically coupled via coupler $L_{14}$-$L_{J13}$-$L_{15}$ to the filter's first resonant section 34 formed from $L_7$ and $L_{15}$ in parallel with $C_{22}$ due to the shared inductor $L_{15}$. The overall maximum coupling strength is determined in part by the ratio of the shared inductance to the total inductance of the BP filter resonant section 34. Each coupler is individually controllable by applying magnetic flux to its associated RF-SQUID loop.

As illustrated in FIG. 3, a control current $I_{CNTL}$ is applied to a control inductor $L_{CNTL}$ that is inductively coupled to inductor $L_{15}$ of the RF SQUID loop formed from $L_{14}$, the inductance $L_{13}$ of the Josephson junction $J_{13}$ and the inductor $L_{15}$ of the first BP filter resonant section 34. The control current induces a flux in the RF SQUID loop and thus, a current through Josephson junction $J_{13}$. The Josephson junction $J_{13}$ has an inductance $L_{J13}$ that can be varied based on a current flowing through the Josephson junction $J_{13}$, and thus the control current $I_{CNTL}$ can control the impedance (e.g., inductance) of the RF SQUID and thus the strength of the coupling of the qubit readout resonator TL1 to the respective resonant filter section 34 via the inductance $L_{13}$ of the tunable coupler. The current flowing through the Josephson junction $J_{13}$ can be induced based on a flux applied to the SQUID.

In one example, the Josephson junction $J_{13}$ can have a first inductance when no current or a low current is induced in the SQUID, and a second inductance when a current or a higher current is induced in the SQUID that is at a predetermined threshold that generates or induces a flux, for example, greater than about 0.1 $\Phi_0$ and less than about 0.45 $\Phi_0$, where $\Phi_0$ is equal to a flux quantum. The first inductance (e.g., $\hbar/2e*1/I_c$, where $\hbar$ is Planck's constant divided by $2\pi$, e is electron charge and $I_c$ is the critical current of the Josephson junction) can be a low inductance that provides coupling between a given qubit readout resonator and the respective resonant filter section and allows the resetting of the qubit. The second inductance (e.g., large inductance value) can be a high inductance which can provide decoupling between the given qubit readout resonator and the respective resonant filter section allowing the state of the qubit to remain unchanged, and/or allow operation on the qubit. An intermediate inductance can be provided by selecting an intermediate control signal to allow for reading of the qubit without resetting of the state of the qubit. This applies for each qubit #1 through #4.

Figure 4A:
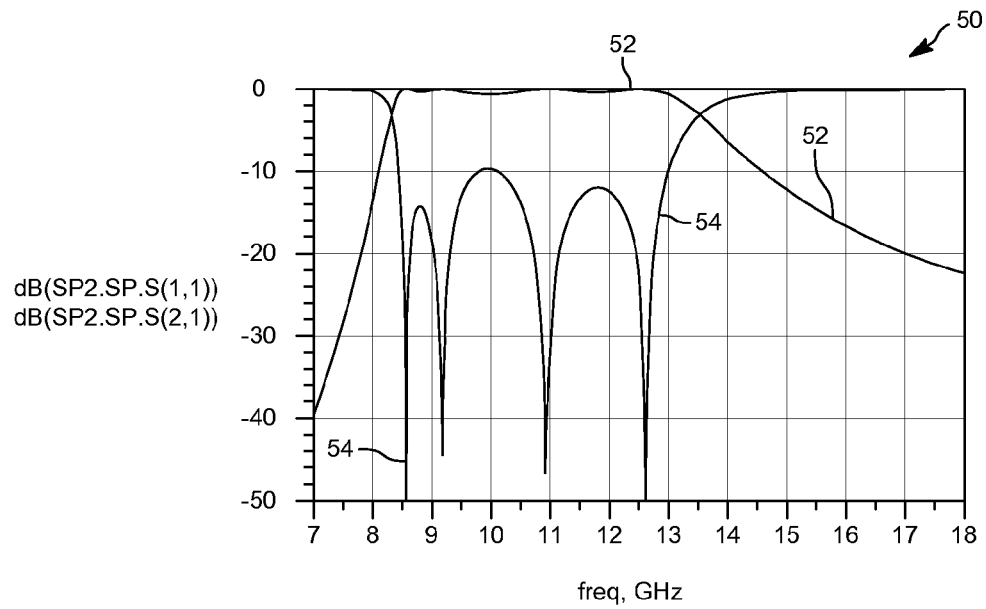
FIG. 4 (a) illustrates a graph of S-parameters versus frequencies showing the filter response with all couplers in their "off" state for a simulation of the operation of FIG. 2 employing Agilent ADS software.
Figure 4B:
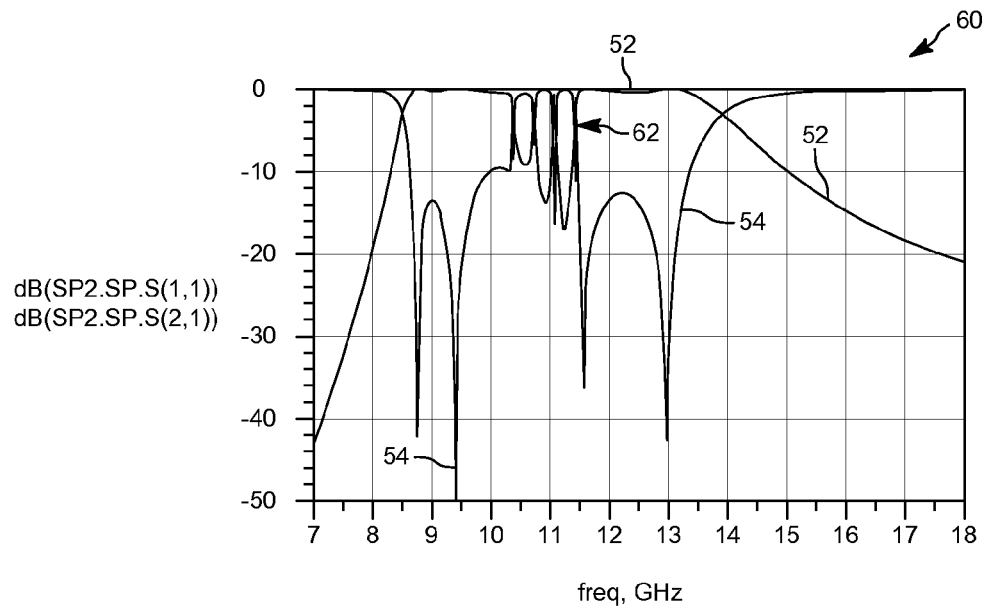

FIG. 4 (a) and FIG. 4 (b) illustrate graphs of S-parameters versus frequency of a filter response for a simulation of the operation of FIG. 2 employing Agilent ADS software. The Josephson junctions are replaced by inductors to simulate the operation of the Josephson junctions and the qubits were omitted so the response is associated with the qubit readout resonator only. FIG. 4 (a) illustrates a graph 50 of S-parameters versus frequencies showing the filter response with all couplers in their "off" state. A first waveform 52 illustrates the $S_{21}$, which is the response of the $READ_{OUT}$ signal given the $READ_{IN}$ signal, or transmission through the BP filter. A second waveform 54 illustrates the response $S_{11}$, which is the reflection of the $READ_{IN}$ signal. FIG. 4 (b) illustrates a graph 60 of S-parameters versus frequencies showing the filter response with all couplers in their "on" state. As illustrated in FIG. 4 (b), four resonator filter responses 62 are shown with each representing a particular qubit readout resonator via their coupling to their respective BP filter resonant section.

Figure 5A:
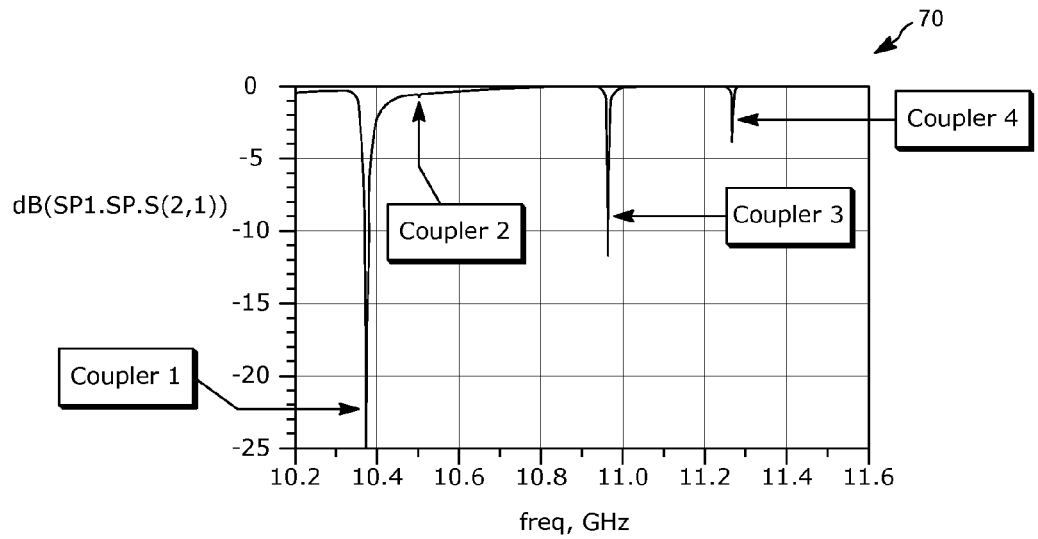
FIG. 5 (a) illustrates a graph of a filter response waveform of $S_{21}$ through the filter, similar to the measurement that is done to read out the qubits for a simulation of the operation of FIG. 2 employing Agilent ADS software with the four different couplers having a particular coupling setting.
Figure 5B:
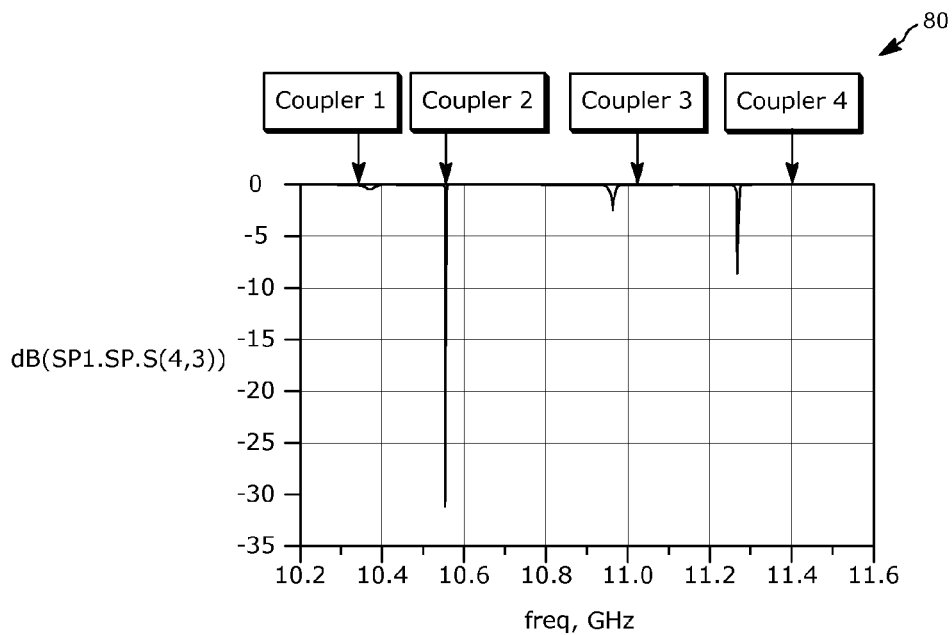

FIG. 5 (a) and FIG. 5 (b) illustrate graphs of transmission versus frequency of filter responses for a simulation of the operation of FIG. 2 employing Agilent ADS software with the four different couplers each having a particular coupling setting. In particular, the configuration of coupler fluxes are set so that Coupler 1 is fully "on", Coupler 2 is fully "off" and Couplers 3 and 4 are set to intermediate coupling states. FIG. 5 (a) illustrates a graph 70 of a filter response waveform of $S_{21}$ through the filter, similar to the measurement that is done to read out the qubits. FIG. 5 (b) illustrates a graph 80 of a response of the qubit readout-resonators seen from a very weakly coupled port, and is a measure of the readout-resonator loaded quality factors.

As illustrated, the first readout resonator, associated with coupler 1 is severely damped owing to coupler 1 being fully on. This coupler setting is useful for fast reset of the associated qubit 1. Readout resonator 2, associated with coupler 2 shows a very sharp dip in the response of FIG. 5(b) indicating high loaded quality factor owing to coupler 2 being essentially off. The same resonator is barely visible in the filter's $S_{21}$ of response of FIG. 5(a). In this coupler setting, the qubit decoherence due to coupling to the 50 Ohm microwave environment is minimized. This setting completely decouples the qubit from the readout circuitry while the computation is taking place. Resonators 3 and 4, which are associated with couplers 3 and 4, respectively, show moderate loaded quality factors, and appear as sharp dips in the graph of FIG. 5(a). In this setting of couplers 3 and 4, the qubits can be read-out using the usual circuit-QED readout techniques.

The simulation results above correspond to the circuit of FIG. 2 with filter resonant section inductance L7+L15=381 pH (and similarly identical L11+L18, L12+L19, and L10+L24), resonant filter section capacitances of C22=C25=0.326 pF, C29=C30=0.318 pF, and filter series capacitors of C26=C27=0.318 pF, C28=C32=0.188 pF, and C31=0.158 pF. The ratio KK of shared inductance to total shunt inductance is KK=L15/(L7+L15)=0.2.

Figure 6:
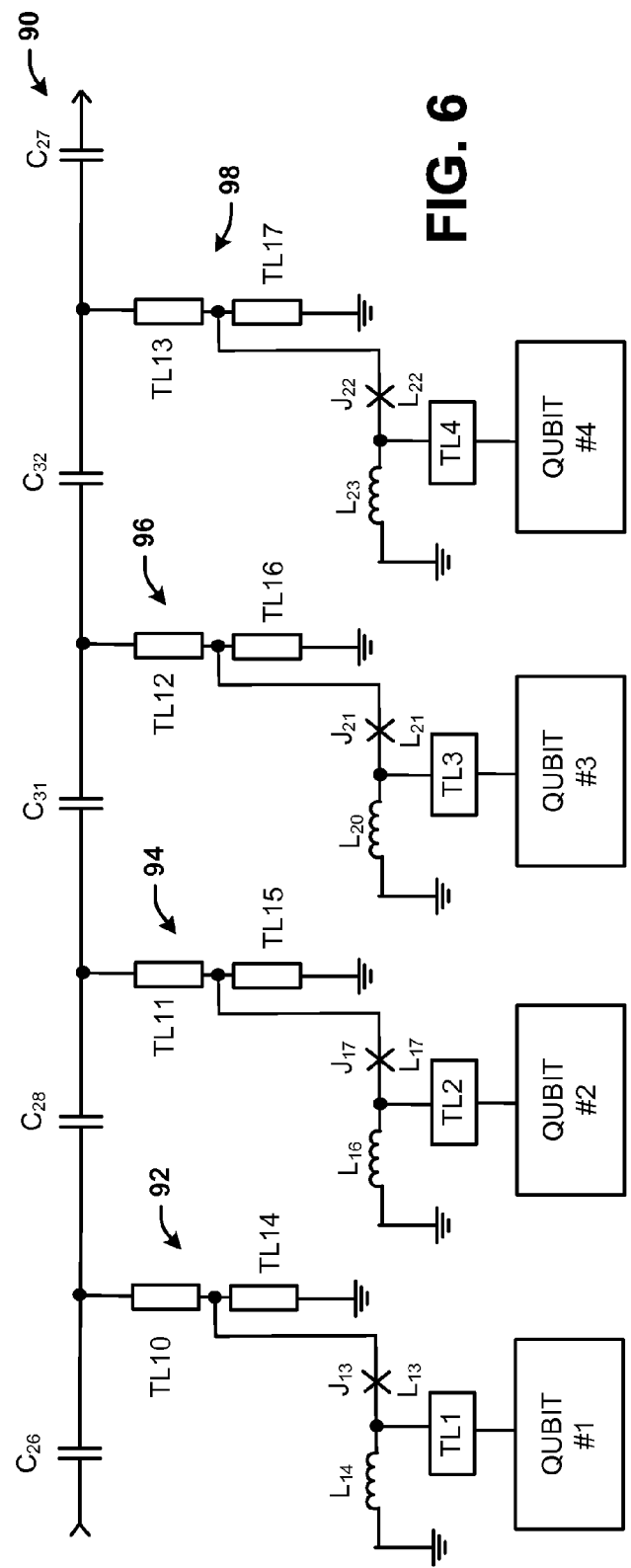
FIG. 6 illustrates yet another example of a system for multiplexed readout of a plurality of qubits.

FIG. 6 illustrates yet another example of a system 90 for multiplexed readout of a plurality of qubits. In the example of FIG. 6, filter's resonant sections 92, 94, 96 and 98 are realized by shorted quarter-wave transmission line stubs instead of lumped-element L and C components. A first BP filter resonant section 92 is formed from transmission line stub TL10 in series with transmission line stub TL14, and a second BP filter resonant section 94 is formed from transmission line stub TL11 in series with transmission line stub TL15. A third BP filter resonant section 96 is formed from transmission line stub TL12 in series with transmission line stub TL16, and a fourth BP filter resonant section 98 is formed from transmission line stub TL13 in series with transmission line stub TL17. This implementation is advantageous because quarter-wave stubs are easier to design in certain microfabrication processes. The stubs can be designed with relatively low impedance (e.g. 20 Ohm) that is suitable for stripline implementation, or with 50 Ohm impedance that is more suitable for coplanar waveguide implementation. The system 90 of FIG. 6 can be planar and can be fabricated using a single metal layer. Galvanic coupling is then provided by connecting the coupler to a node located a distance KK (in degrees) away from the shorted end of the stubs as shown in FIG. 6.

For example, circuit component values suitable for stripline and CPW implementations of FIG. 6 are tabulated below. In general, stub frequency $\omega_n$ and impedance $Z_n$ of section n are related to the lumped element inductor $L_n$ and capacitor $C_n$ of the $n^{th}$ section by $\omega_n = 1/\text{sqrt}(L_n C_n)$, and $Z_n = \pi/4\omega_n C_n$.

TABLE I

| filter section | component | stripline implementation | | CPW implementation | |
| --- | --- | --- | --- | --- | --- |
| | | resonant frequency | impedance | resonant frequency | impedance |
| 1 | TL10/TL14 | 14.274 GHz | 26.847 Ohm | 17.318 GHz | 65.146 Ohm |
| 2 | TL11/TL15 | 14.457 GHz | 27.191 Ohm | 14.457 GHz | 54.382 Ohm |
| 3 | TL12/TL16 | 14.457 GHz | 27.191 Ohm | 14.457 GHz | 54.382 Ohm |
| 4 | TL13/TL17 | 14.274 GHz | 26.847 Ohm | 17.318 GHz | 65.146 Ohm |

| series capacitor | component | stripline implementation value (pF) | CPW implementation value (pF) |
| --- | --- | --- | --- |
| 1 | C26 | 0.318 | 0.184 |
| 2 | C28 | 0.188 | 0.094 |
| 3 | C31 | 0.158 | 0.079 |
| 4 | C32 | 0.188 | 0.094 |
| 5 | C27 | 0.318 | 0.184 |

Figure 7A:
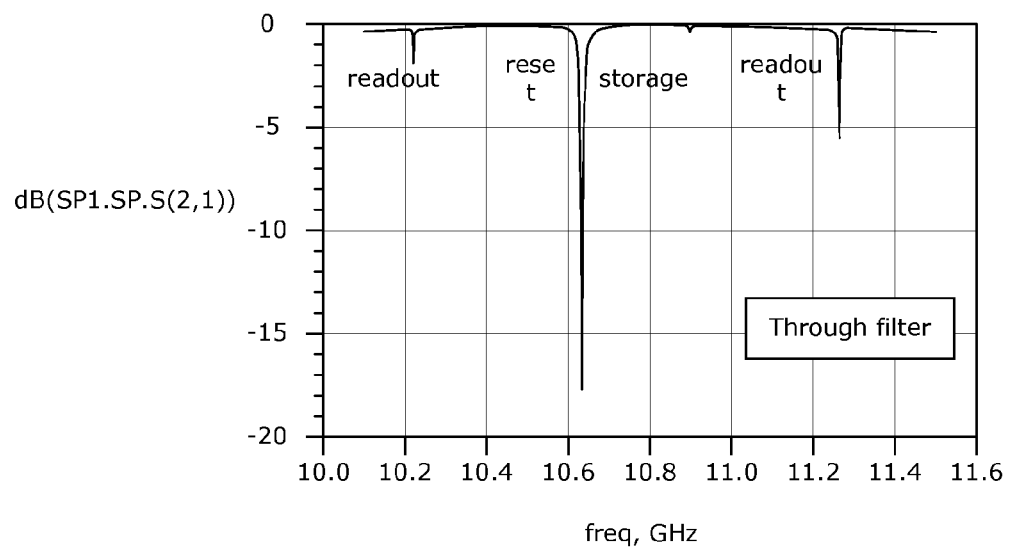
FIG. 7 (a) illustrates a graph of an example S-parameter versus frequency of the filter responses for a simulation of the operation of FIG. 6 employing Agilent ADS software.
Figure 7B:
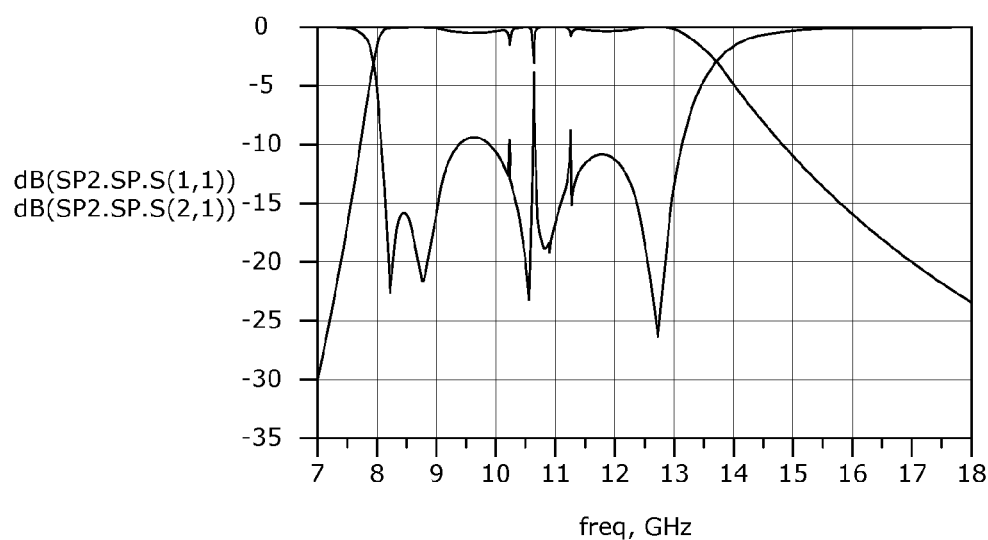

FIG. 7 (a) and FIG. 7 (b) illustrate graphs of S-parameters versus frequency of filter responses for a simulation of the operation of FIG. 6 employing Agilent ADS software. ADS simulation of the filter of an example S-parameter are shown in FIG. 7 (b) for a certain instance of coupler fluxes, with couplers 1 and 4 set for readout (intermediate coupling), coupler 2 adjusted for qubit reset (strong coupling), and coupler 3 adjusted to its "off" state for qubit storage/coherent operation (strong isolation). ADS simulation of the filter of an example of alternate S-parameters are shown in FIG. 7 (b).

To summarize, galvanic coupling between resonators and a 50 Ohm environment with a tunable coupling strength as disclosed is suitable for multiplexed qubit readout and reset in a circuit-QED architecture which is highly beneficial. Galvanic coupling allows strong maximum coupling, and is facilitated by embedding the coupler circuit in a band-pass filter circuit.

Figure 8:
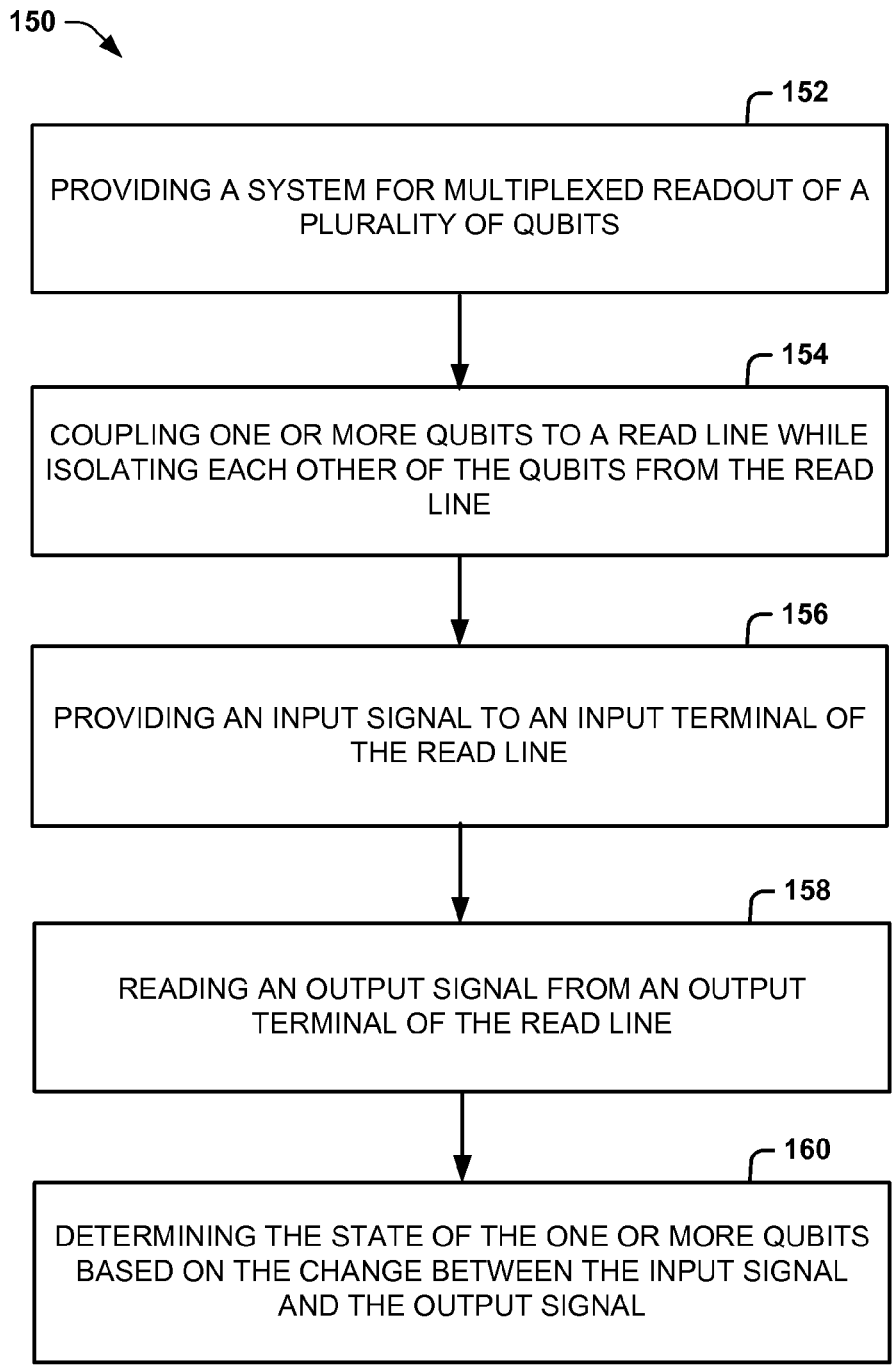
FIG. 8 illustrates an example of a method for multiplexed readout of a plurality of qubits.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 150 for multiplexed readout of a plurality of qubits. At 152, a system is provided for multiplexed readout of a plurality of qubits. The system can comprise a plurality of bandpass (BP) filter resonant sections forming a BP filter with each BP filter resonant section being coupled between a different respective point on a read line and a respective qubit of a plurality of qubits through its respective qubit readout resonator of a plurality of qubit readout resonators. The system can include a plurality of SQUIDs each being controllable to allow for individual coupling strength tunability of each respective qubit to the read line. Each SQUID can be galvanically coupled to a respective BP filter resonant section, and share a common inductance with the respective BP filter resonant section. The methodology then proceeds to 154.

At 154, one or more qubits to be read are coupled to a read line while all of the other plurality of qubits are isolated from the read line. The read line can comprise a plurality of coupling capacitors coupled in series with one another. The coupling of the one or more qubits can be strong coupling which allows for a fast reset of the associated qubit. Alternatively, the coupling can be an intermediate coupling, which can which provides a read and can be continuously tuned to optimize the readout fidelity. At 156, an input signal is provided to an input port of a read line. At 158, an output signal is read from an output port of the read line based on the input signal. At 160, the state of the one or more qubits to be read are determined based on the change between the input signal and the output signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system for readout of qubits, the system comprising:
   a plurality of bandpass (BP) filter resonant sections that are each coupled to a different respective point on a read line, wherein each BP filter resonant section is coupleable to a respective qubit through a respective qubit readout resonator;
   a plurality of tunable couplers, wherein each tunable coupler is coupled between a respective BP filter resonant section and a qubit readout resonator; and
   a coupling controller that controls the coupling strength of each qubit to the read line by controlling the impedance of each tunable coupler of the plurality of tunable couplers.

2. The system of claim 1, wherein the impedance of each tunable coupler can be controlled by the coupling controller to provide one of strong coupling of its respective qubit to the read line, strong isolation of its respective qubit to the read line and intermediate coupling of its respective qubit to the read line.

3. The system of claim 2, wherein strong coupling of a respective qubit allows for a fast reset of that respective qubit removing any state information from the qubit, a strong isolation of a respective qubit allows for operations to be performed on the respective qubit without any coupling of the respective qubit to the read line, and the retention of state information for the respective qubit, and intermediate tunable coupling of the respective qubit allows for a high fidelity readout of the qubit state.

4. The system of claim 1, wherein each tunable coupler is galvanically coupled to its respective BP filter resonant section.

5. The system of claim 1, wherein each tunable coupler is a superconducting quantum interference device (SQUID) having at least one Josephson junction, such that the current through the at least one Josephson junction changes the inductance of the SQUID and the coupling strength of its respective qubit to the read line.

6. The system of claim 5, wherein each tunable coupler and its respective BP resonant section share a common inductance.

7. The system of claim 1, wherein each BP filter resonant section is formed from lumped elements comprising an inductor and a capacitor.

8. The system of claim 1, wherein each BP filter resonant section is formed from one or more transmission line stubs.

9. The system of claim 1, wherein the read line is formed from a plurality of series coupled coupling capacitors coupled to one another.

10. The system of claim 1, wherein one or more qubits to be read can be coupled to the read line at a time.

11. The system of claim 10, wherein the read line includes an input port and an output port, wherein an input signal provided at the input port is altered by a read of one or more qubits, such that the altered input signal can be provided as an output signal at an output port that can provide the state of the one or more qubits.

12. A system for multiplexed readout of qubits, the system comprising:
    a plurality of bandpass (BP) filter resonant sections forming a BP filter, each BP filter resonant section being coupled between a different respective point on a read line and a respective qubit through its respective qubit readout resonator;
    a plurality of tunable couplers, each tunable coupler being galvanically coupled to a respective BP filter resonant section, wherein each tunable coupler is a superconducting quantum interference device (SQUID) having at least one Josephson junction, such that flux induced in the SQUID changes the inductance of the at least one Josephson junction and the coupling strength of its respective qubit to the read line; and
    a coupling controller that controls the coupling strength of each qubit to the read line by controlling an amount of flux induced in each SQUID.

13. The system of claim 12, wherein the coupling strength of each qubit to the read line can be one of strong coupling, strong isolation and intermediate coupling.

14. The system of claim 12, wherein each tunable coupler and its respective BP resonant section share a common inductance.

15. The system of claim 12, wherein the read line is formed from a plurality of series coupled coupling capacitors coupled to one another.

16. The system of claim 12, wherein the read line includes an input port and an output port, wherein an input signal provided at the input port is altered by a read of one or more qubits of the plurality of qubits, such that the altered input signal can be provided as an output signal at an output port that can provide the state of the one or more qubits.

17. A method for multiplexed readout of qubits, the method comprising:
    providing a system comprising a plurality of bandpass (BP) filter resonant sections forming a BP filter, each BP filter resonant section being coupled between a different respective point on a read line and a respective qubit of a plurality of qubits through its respective qubit readout resonator of a plurality of qubit readout resonators;
    coupling one more qubits to the read line, while isolating each of the other of the plurality of qubits from the read line;
    providing an input signal to an input port of the read line;
    reading an output signal from an output port of the read line; and
    determining the state of the one or more qubits based on the change between the input signal and the output signal.

18. The method of claim 17, wherein the coupling of the one or more qubits to the read line comprises one of strong coupling of at least one qubit to the read line to reset the state of the at least one qubit, intermediate coupling of the at least one qubit to the read line to read the state of the at least one qubit, or strong isolation of the at least one qubit to the read line to allow for operations to be performed on the at least one qubit.

19. The method of claim 17, wherein the coupling of the one or more qubits to the read line comprises tunable intermediate coupling of the one or more qubits to the read line for high fidelity read out of the state of the one or more qubits.

20. The method of claim 17, wherein the providing a system comprises providing a plurality of superconducting quantum interference devices SQUIDs, each SQUID being galvanically coupled to a respective BP filter resonant section, and further comprising inducing an amount of flux in each SQUID that controls the coupling strength of its respective qubit to the read line.

\* \* \* \* \*